US012696548B2

(12) United States Patent
Tong et al.

(10) Patent No.: US 12,696,548 B2
(45) Date of Patent: Jul. 28, 2026

(54) THREE-DIMENSIONAL FRAMEWORK SILICON/PEROVSKITE TANDEM SOLAR CELL AND ITS PREPARATION METHOD

(71) Applicant: Hefei Polytechnic University, Hefei (CN)

(72) Inventors: Guoqing Tong, Hefei (CN); Xuean Liu, Hefei (CN); Yuxin Shi, Hefei (CN); Yang Jiang, Hefei (CN)

(73) Assignee: Hefei Polytechnic University, Hefei (CN)

( * ) Notice: Subject to any disclaimer, the term of this patent is extended or adjusted under 35 U.S.C. 154(b) by 0 days.

(21) Appl. No.: 18/646,832

(22) Filed: Apr. 26, 2024

(65) Prior Publication Data

US 2025/0267957 A1 Aug. 21, 2025

(30) Foreign Application Priority Data

Feb. 19, 2024 (CN) .......................... 202410184547.5

(51) Int. Cl.
H10F 10/172 (2025.01)
H10F 71/00 (2025.01)
(Continued)

(52) U.S. Cl.
CPC ......... H10F 10/172 (2025.01); H10F 71/121 (2025.01); H10F 77/147 (2025.01); H10F 77/1662 (2025.01)

(58) Field of Classification Search
CPC .. H10F 10/172; H10F 77/147; H10F 77/1662; H10F 71/121
See application file for complete search history.

(56) References Cited

U.S. PATENT DOCUMENTS

2008/0047604 A1* 2/2008 Korevaar .............. H10F 77/148
136/258
2015/0000730 A1* 1/2015 Yu .......................... B82Y 10/00
136/255
(Continued)

FOREIGN PATENT DOCUMENTS

CN 107369767 A * 11/2017 ............. H10K 30/81
CN 111244210 A * 6/2020 ........... H10F 71/137

OTHER PUBLICATIONS

CN 107369767 A, Machine Translation, 2017 (Year: 2017).*
CN 111244210 A, Machine Translation (Year: 2020).*

*Primary Examiner* — Devina Pillay
(74) *Attorney, Agent, or Firm* — Hemisphere Law, PLLC

(57) ABSTRACT

The invention relates to the technical field of solar cells, in particular to a three-dimensional framework silicon/perovskite tandem solar cell and its preparation method. The three-dimensional framework silicon/perovskite tandem solar cell comprises a formal structure or a trans structure; a p-type amorphous silicon layer, a top electrode light-transmitting layer, an n-type transmission layer, a perovskite thin film, a p-type transmission layer, a buffer layer and a transparent electrode which are sequentially laminated on a substrate from bottom to top; when it is in a trans structure, it comprises a p-type silicon nanowire, an i-type intrinsic amorphous silicon layer, an n-type amorphous silicon layer, a top electrode light-transmitting layer, a p-type transmission layer, a perovskite thin film. The present invention can improve the absorption efficiency of the cell for incident light, broaden the absorption spectrum, and further improve the photoelectric conversion efficiency of the solar cell.

6 Claims, 8 Drawing Sheets

(51) Int. Cl.
    H10F 77/14      (2025.01)
    H10F 77/166     (2025.01)

(56)            References Cited

U.S. PATENT DOCUMENTS

2017/0162809 A1 *   6/2017   Fang ..................... H10K 71/12
2019/0081189 A1 *   3/2019   Mishima .............. H10F 77/122

* cited by examiner

(b)                    p-i-n (b)

Cross-sectional view of
three-dimensional
framework
silicon/perovskite
tandem solar cell

THREE-DIMENSIONAL FRAMEWORK SILICON/PEROVSKITE TANDEM SOLAR CELL AND ITS PREPARATION METHOD

TECHNICAL FIELD

The invention relates to the technical field of solar cells, in particular to a three-dimensional framework silicon/perovskite tandem solar cell and its preparation method.

BACKGROUND

As a low-dimensional silicon material, silicon nanowires have different characteristics from bulk silicon or thin film silicon. As a good light trapping structure, the array of silicon nanowires has a good anti-reflection effect in the whole solar spectrum range, which further enhances the absorption and utilization of light waves, making silicon nanowires an extremely ideal material in the photovoltaic field. At present, the solar cell based on silicon nanowires-silicon nanowire solar cell has been widely studied. However, at present, the photoelectric conversion efficiency of silicon nanowire solar cells in the current technology is generally around 6%-8%, and the photoelectric conversion efficiency is low. Therefore, how to improve the photoelectric conversion efficiency of silicon nanowire solar cells has become an urgent technical problem in the technical field of solar cells.

SUMMARY

Based on the above, the present invention provides a three-dimensional framework silicon/perovskite tandem solar cell and its preparation method. According to the invention, a silicon nanowire solar cell is used as the basis, and a three-dimensional framework silicon/perovskite tandem solar cell is constructed by depositing a perovskite solar cell on the basis of the silicon nanowire solar cell, so that the photoelectric conversion efficiency of the cell can be significantly improved.

In order to achieve the above purposes, the present invention provides the following scheme:

According to the first technical schemes of the invention, a three-dimensional framework silicon/perovskite tandem solar cell comprises a formal structure or a trans structure;

when the three-dimensional framework silicon/perovskite tandem solar cell is in a formal structure, it comprises an n-type silicon nanowire, an i-type intrinsic amorphous silicon layer (a-Si:H), a p-type amorphous silicon layer, a top electrode light-transmitting layer (one of ITO, FTO, AZO or TCO), an n-type transmission layer, a perovskite thin film, a p-type transmission layer, a buffer layer and a transparent electrode which are sequentially laminated on a substrate from bottom to top;

when the three-dimensional framework silicon/perovskite tandem solar cell is in a trans structure, it comprises a p-type silicon nanowire, an i-type intrinsic amorphous silicon layer (a-Si:H), an n-type amorphous silicon layer, a top electrode light-transmitting layer (one of ITO, FTO, AZO or TCO), a p-type transmission layer, a perovskite thin film, an n-type transmission layer and a transparent electrode which are sequentially laminated on a substrate from bottom to top.

According to the second technical scheme of the invention, a preparation method for the three-dimensional framework silicon/perovskite tandem solar cell comprises the following steps when the three-dimensional framework silicon/perovskite tandem solar cell is in a formal structure:

step 1: prepare an n-type silicon nanowire on a substrate;

step 2: sequentially deposit the i-type intrinsic amorphous silicon layer, the p-type amorphous silicon layer and the top electrode light-transmitting layer on the n-type silicon nanowire;

step 3: sequentially prepare the n-type transmission layer, the perovskite film, the p-type transmission layer, the buffer layer and the transparent electrode on the top electrode light-transmitting layer to obtain the three-dimensional framework silicon/perovskite tandem solar cell;

when the three-dimensional framework silicon/perovskite tandem solar cell is in a trans structure, it comprises the following steps:

step 1: prepare the p-type silicon nanowire on a substrate;

step 2: sequentially deposit the i-type intrinsic amorphous silicon layer, the n-type amorphous silicon layer and the top electrode light-transmitting layer on the p-type silicon nanowire;

step 3: sequentially preparing the p-type transmission layer, the perovskite film, the n-type transmission layer and the transparent electrode on the top electrode light-transmitting layer to obtain the three-dimensional framework silicon/perovskite tandem solar cell.

The invention discloses the following technical effects:

The three-dimensional framework silicon/perovskite tandem solar cell has a three-dimensional framework structure, and the traditional plane structure is replaced by the radial structure of silicon nanowires; through the one-dimensional growth of silicon nanowires, the three-dimensional framework silicon/perovskite tandem solar cell is formed by combining the silicon nanowire solar cell with radial structure and the perovskite solar cell. At the same time, the spatial array formed by silicon nanowires can enhance the reflection of light on the three-dimensional structure, enhance the multiple reflections of incident light, not only improve the absorption of incident light by silicon and perovskite films, but also realize the optical absorption complementation of silicon and perovskite layers, improve the absorption efficiency of the cell for incident light, broaden the absorption spectrum, and further improve the photoelectric conversion efficiency of solar cells.

The silicon nanowires and perovskite films prepared by the method in the present invention have good uniformity and high repetition rate, and can meet the requirements of large-scale preparation.

DETAILED DESCRIPTION OF EMBODIMENTS

Figure 1:
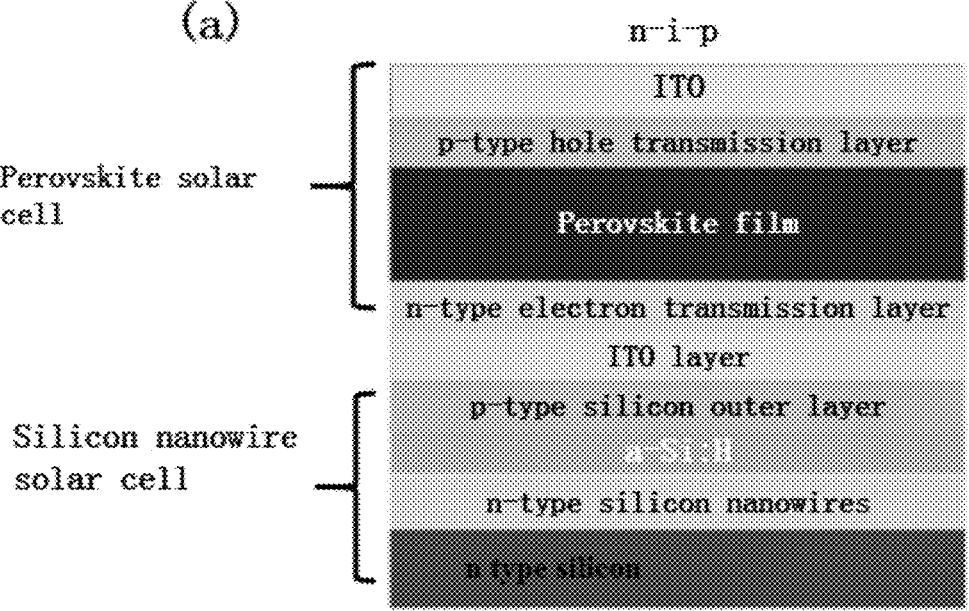
FIG. 1 is a schematic plan view of the three-dimensional framework silicon/perovskite tandem solar cell of the present invention; wherein (a) is a formal structure (n-i-p) and (b) is a trans structure (p-i-n).
Figure 1B:
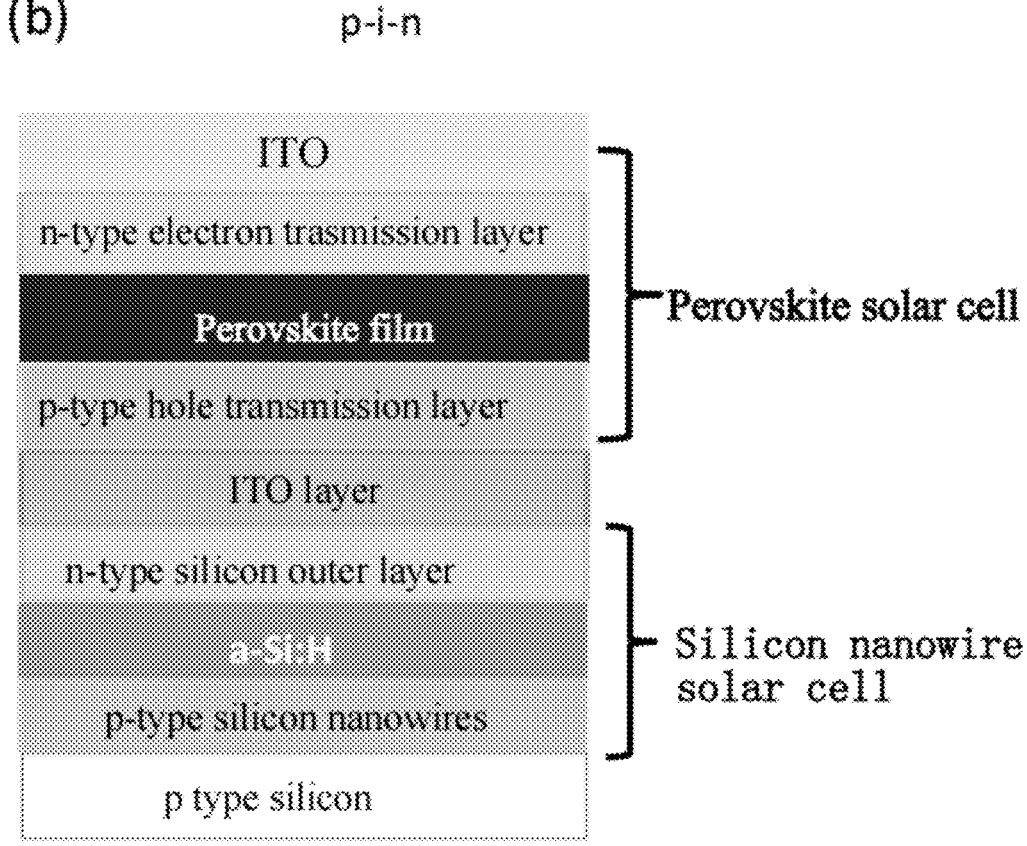

Unless otherwise specified, "%" in the present invention means mass percentage.

According to the first technical scheme of the invention, a three-dimensional framework silicon/perovskite tandem solar cell comprise a formal structure (n-i-p) or a trans structure (p-i-n);

When the three-dimensional framework silicon/perovskite tandem solar cell is in a formal structure, it comprises an n-type silicon nanowire, an i-type intrinsic amorphous silicon layer (a-Si:H), a p-type amorphous silicon layer, a top electrode light-transmitting layer (one of ITO, FTO, AZO or TCO), an n-type transmission layer (n-type electron transmission layer), a perovskite thin film, a p-type transmission layer (p-type hole transmission layer), a buffer layer and a transparent electrode which are sequentially laminated on a substrate from bottom to top. The n-type electron transmission layer is specifically an n-type $SnO_2$ electron transmission layer or a $TiO_2$ electron transmission layer with a thickness of about 10-30 nm; the p-type hole transmission layer is specifically a 2,2',7,7'-tetra [N,N-bis(4-methoxyphenyl)amino]-9,9'-Spiro-OMeTAD film or a NiOx film with a thickness of 50-200 nm; the buffer layer is a $MoO_3$ buffer layer with a thickness of 3-10 nm; and the thickness of the transparent electrode is 50-200 nm.

In the three-dimensional framework silicon/perovskite tandem solar cell with formal structure of the present invention, the p-type hole transmission layer needs to be thinner, so that more incident light can be irradiated into the perovskite solar cell and the silicon solar cell, and finally the short-circuit current of the cell will be improved. If the p-hole transmission layer is too thick, it will block light, resulting in less light absorption and low current. However, if the p-type hole transmission layer is too thin, it will not completely cover the perovskite film to form the p-type hole layer, which will lead to that the photo-generated current cannot be completely extracted effectively, and finally the short-circuit current of the cell will be low.

When the three-dimensional framework silicon/perovskite tandem solar cell is in a trans structure, it comprises a p-type silicon nanowire, an i-type intrinsic amorphous silicon layer (a-Si:H), an n-type amorphous silicon layer, a top electrode light-transmitting layer (one of ITO, FTO, AZO or TCO), a p-type transmission layer (p-type hole transmission layer), a perovskite thin film, an n-type transmission layer (n-type electron transmission layer) and a transparent electrode which are sequentially laminated on a substrate from bottom to top. The p-type hole transmission layer is specifically a p-type NiOx hole transmission layer with a thickness of 10-30 nm; the n-type electron transmission layer is a C60 thin film (thickness 5-100 nm) and/or a $SnO_2$ electron transmission layer (thickness 10-100 nm); and the thickness of the transparent electrode is 50-200 nm.

In the three-dimensional framework silicon/perovskite tandem solar cell with trans structure of the present invention, the n-type electron transmission layer needs to be thinner, so that more incident light can be irradiated into the perovskite solar cell and the silicon solar cell, and finally the short-circuit current of the cell will be improved. If the n-type electron transmission layer is too thick, it will block light, resulting in less light absorption and low current. However, if the n-type electron transmission layer is too thin, it will not completely cover the perovskite film to form the n-type electron transmission layer, which will lead to that the photo-generated current cannot be completely extracted effectively, and finally the short-circuit current of the cell will be low.

In a preferred embodiment of the present invention, when the three-dimensional framework silicon/perovskite tandem solar cell is in a formal structure, a tunneling layer is arranged between the top electrode light-transmitting layer and the n-type transmission layer (Gold thin film with a thickness of about 2 nm);

when the three-dimensional framework silicon/perovskite tandem solar cell is in a trans structure, a tunneling layer is arranged between the top electrode light-transmitting layer and the p-type transmission layer (Gold thin film with a thickness of about 2 nm).

In the preferred embodiment of the present invention, the length of the n-type silicon nanowire is 300-10000 nm and the diameter is 10-300 nm; the length of the p-type silicon nanowire is 300-10000 nm, and the diameter is 10-300 nm; in a further preferred embodiment of the present invention, the length of the n-type silicon nanowire or the p-type silicon nanowire is 500-700 nm, and the diameter is 10-200 nm.

In the preferred embodiment of the present invention, the substrate is one of a p-type silicon wafer, an n-type silicon wafer, AZO transparent conductive glass or tin foil paper.

In the preferred embodiment of the present invention, the perovskite thin film is one of organic-inorganic hybrid perovskite (such as $MAPbI_3$, $FAPbI_3$, and $CsFAMAPb_{3-x}Br_x$, etc.) all-inorganic perovskite (such as $CsPbI_3$, $CsPbBr_3$ and $CsPbI_{3-x}Br_x$, etc.), tin-lead mixed perovskite (such as $CsFAPbSnI_3$ and $CsFAPbSnI_{3-x}Br_x$, etc.) or non-lead perovskite ($FASnI_3$, $MASnI_3$ and $Cs_2AgBiBr_6$, etc.).

According to the second technical scheme of the invention, a preparation method for the three-dimensional framework silicon/perovskite tandem solar cell comprises the following steps when the three-dimensional framework silicon/perovskite tandem solar cell is in a formal structure:

step 1: prepare an n-type silicon nanowire on a substrate by adopting plasma enhanced chemical vapor deposition (PECVD);

step 2: sequentially deposit the i-type intrinsic amorphous silicon layer, the p-type amorphous silicon layer and the top electrode light-transmitting layer on the n-type silicon nanowire;

step 3: sequentially prepare the n-type transmission layer, the perovskite film, the p-type transmission layer, the buffer layer and the transparent electrode on the top electrode light-transmitting layer to obtain the three-dimensional framework silicon/perovskite tandem solar cell;

when the three-dimensional framework silicon/perovskite tandem solar cell is in a trans structure, it comprises the following steps:

step 1: prepare the p-type silicon nanowire on a substrate by adopting the PECVD;

step 2: sequentially deposit the i-type intrinsic amorphous silicon layer, the n-type amorphous silicon layer and the top electrode light-transmitting layer on the p-type silicon nanowire;

step 3: sequentially preparing the p-type transmission layer, the perovskite film, the n-type transmission layer and the transparent electrode on the top electrode light-transmitting layer to obtain the three-dimensional framework silicon/perovskite tandem solar cell.

In the preferred embodiment of the present invention, when the three-dimensional framework silicon/perovskite tandem solar cell is in a formal structure, the step of preparing metal film nanoparticles on the surface of the substrate before preparing the n-type silicon nanowires on the substrate is also included; before preparing the n-type transmission layer on the top electrode light-transmitting layer, it also includes the step of constructing the tunneling layer on the top electrode light-transmitting layer; and the annealing temperature of the n-type transmission layer is 150~500° C. for 30~60 min.

In the preferred embodiment of the present invention, when the three-dimensional framework silicon/perovskite tandem solar cell is in a trans structure, the step of preparing metal film nanoparticles on the surface of the substrate before preparing the p-type silicon nanowires on the substrate is also included; before preparing the n-type transmission layer on the top electrode light-transmitting layer, it also includes the step of constructing the tunneling layer on the top electrode light-transmitting layer; and the annealing temperature of the p-type transmission layer is 25~500° C. for 30~60 min.

In the preferred embodiment of the present invention, when the three-dimensional framework silicon/perovskite tandem solar cell is in a formal structure or a trans structure, the perovskite thin film is prepared by liquid-phase spin coating, vacuum vapor phase deposition or liquid-phase assisted vapor phase method.

In the preferred embodiment of the present invention, when the three-dimensional framework silicon/perovskite tandem solar cell is in a formal structure or a trans structure, the n-type transmission layer is prepared by vapor deposition, magnetron sputtering, liquid phase spin coating/spraying or chemical water bath deposition; the p-type transmission layer is prepared by liquid phase spin coating, vacuum vapor phase deposition or magnetron sputtering.

When liquid phase spin coating/spraying is adopted, the ambient temperature is 25° C. and the humidity is less than 30%.

In the preferred embodiment of the present invention, when the perovskite film is MAPbI$_3$, it is prepared by the following steps: firstly, deposit a layer of PbI$_2$ film with a thickness of 250 nm, then deposit a layer of MAI film with a thickness of 250 nm (the deposition rate is 0.5 Å/s), and after the deposition is completed, take out the sample and anneal it in dry air at a temperature of 150° C. for 10 minutes to obtain the perovskite film.

When the perovskite film is CsPbBr$_3$, it is prepared by the following steps: firstly, deposit a layer of PbBr$_2$ film with a thickness of 250 nm, then deposit a layer of CsBr film with a thickness of 250 nm (the deposition rate is 0.5 Å/s), and after the deposition is completed, take out the sample and anneal it in dry air at a temperature of 250° C. for 10 minutes to obtain the perovskite film.

The method of the present invention can adopt full-vacuum vapor phase deposition, thus avoiding the use of organic solvents and reducing the influence of the external environment during the preparation of the cell. According to the invention, a tunneling layer is prepared on the n-type silicon nanowire solar cell (n-type silicon nanowire is grown on an n-type silicon wafer, and the i-type intrinsic amorphous silicon layer, the p-type amorphous silicon layer and the top electrode light-transmitting layer are deposited), and the n-type electron transmission layer, the perovskite thin film, the p-type hole transmission layer, the buffer layer and the transparent electrode are sequentially deposited. Or, the tunneling layer is prepared on the p-type silicon nanowire solar cell (p-type silicon nanowire is grown on the p-type silicon wafer, and the i-type intrinsic amorphous silicon layer, the n-type amorphous silicon layer and the top electrode light-transmitting layer are deposited), and the p-type hole transmission layer, the perovskite thin film, the n-type electron transmission layer and the transparent electrode are sequentially deposited, so that the photoelectric conversion efficiency of the n-type or p-type silicon nanowire solar cell is effectively improved. The invention is based on the silicon nanowire solar cell, and the perovskite solar cell is prepared by depositing on the basis of the silicon nanowire solar cell to construct a tandem solar cell. According to the invention, visible light and short-wavelength incident light are absorbed by the perovskite solar cell, near-infrared long-wavelength incident light is absorbed by the silicon nanowire solar cell, and the reflection structure of the silicon nanowire is utilized to increase the multiple reflections of the light, so that the absorption efficiency of the incident light is improved, and further the photocurrent and efficiency of the tandem solar cell are improved.

The method comprises the following steps: firstly, grow silicon nanowires on a substrate, and then deposit and crystallize a plurality of amorphous silicon films to construct the silicon nanowire solar cell. Taking the silicon nanowire solar cell as the bottom cell, the tunneling layer, perovskite functional layer, perovskite active layer and electrode material are prepared on its surface in turn, and the perovskite thin film cell is prepared as the top cell. By adjusting the material composition in perovskite solar cell and the energy band structure of silicon nanowire solar cell and perovskite solar cell, silicon/perovskite tandem solar cell is prepared, which can improve the light absorption of tandem solar cell, increase the photocurrent density and improve the photoelectric conversion efficiency of silicon/perovskite tandem solar cell.

The silicon nanowire has a one-dimensional transmission structure, which can improve the charge transmission efficiency. At the same time, the silicon/perovskite tandem solar cell prepared by using silicon nanowires as a template has a three-dimensional structure, which can increase the multiple reflection and absorption of incident light in the cell and improve the light absorption efficiency. The invention provides theoretical guidance and technical support for preparing high-efficiency and low-cost silicon/perovskite tandem solar cell devices and improving their performance.

The schematic plan view of the three-dimensional framework silicon/perovskite tandem solar cell of the present invention is shown in FIG. 1. Wherein, (a) is a formal structure (n-i-p), and a MoO$_3$ layer is also arranged between the p-type hole transmission layer and the ITO layer in the formal structure, which is not shown in the figure; (b) is a trans structure (p-i-n).

Figure 2A:
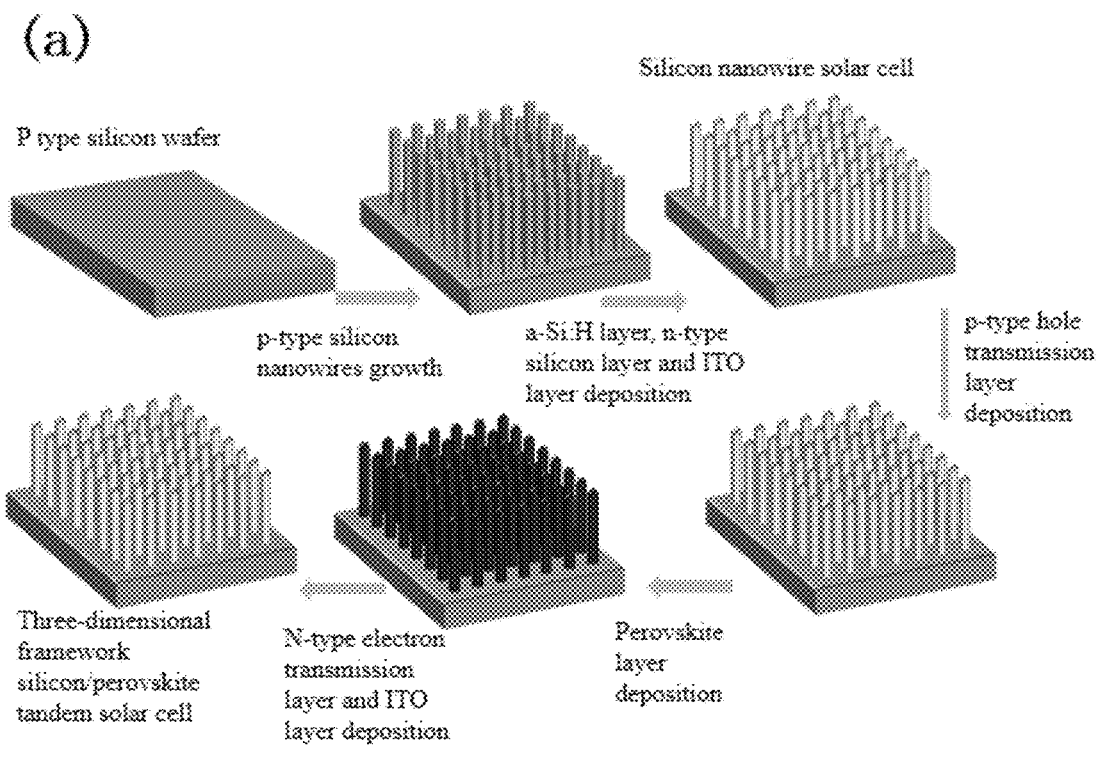
FIG. 2 is a process flow chart and a three-dimensional structure diagram of the three-dimensional framework silicon/perovskite tandem solar cell in Embodiment 2 of the present invention; wherein, (a) is a preparation process flow chart, and (b) is a three-dimensional structure diagram.
Figure 2B:
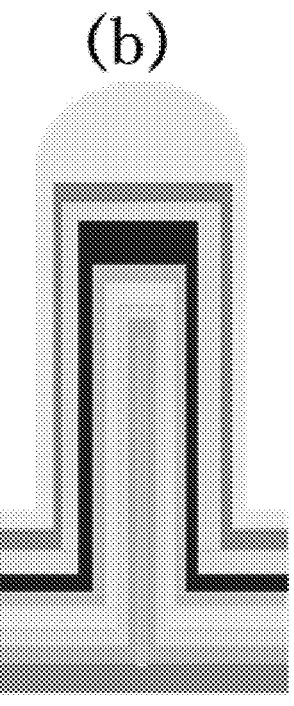

The process flow chart and a three-dimensional structure diagram of the three-dimensional framework silicon/perovskite tandem solar cell in Embodiment 2 of the present invention are shown in FIG. 2 (in the figure, the three-dimensional framework silicon/perovskite tandem solar cell means the three-dimensional framework silicon/perovskite tandem solar cell); wherein, (a) is a preparation process flow chart, and (b) is a three-dimensional structure diagram.

Unless otherwise specified, the raw materials used in the embodiments and comparative examples of the present invention can be obtained through commercial channels.

The test method involved in the embodiment of the invention is as follows: volt-ampere characteristic curve (J-V curve), which is to test the voltage-current by placing the solar cell in a standard sunlight simulator (light intensity AM 1.5 G (~100 mW/cm$^2$)) to obtain the open-circuit voltage, short-circuit current density, filling factor and photoelectric conversion efficiency.

The present invention will be further illustrated by embodiments.

Embodiment 1 (n Silicon Wafer, n-i-p)

This embodiment provides a preparation method the three-dimensional framework silicon/perovskite tandem solar cell with the n-type silicon wafer as a substrate by vapor phase deposition technology, and the specific steps are as follows:

Step 1: Treat the surface of n-type silicon wafer with the HF with a concentration of 25% (5-30% is acceptable) to remove the oxide layer, and deposit a metal Sn film with a thickness of 5 nm on the surface (deposit at a vacuum degree of 10$^{-4}$ Pa with a deposition rate of 0.1 Å/s) to obtain a silicon wafer coated with Sn film.

Step 2: Place the silicon wafer coated with Sn film obtained in step 1 in a PECVD chamber, vacuumize, and then treat with hydrogen plasma for 2 min (parameter setting of plasma treatment: firstly vacuumize the chamber to 10$^{-4}$ Pa, then heat the sample to 200° C. through a heating table, and introduce 20 sccm of hydrogen to keep the vacuum degree in the chamber at 20 Pa and the hydrogen ignite for 3 minutes) to obtain Sn film nanoparticles.

Step 3: Heat the PECVD chamber to 400° C., introduce mixed gas of phosphorane with a volume fraction of 5% and silane with a volume fraction of 95%, and perform ignition growth (time is 8 minutes; keep the temperature in the chamber at 400° C. during the ignition growth), and prepare n-type silicon nanowires with a length of about 500-700 nm and a diameter of about 100-200 nm.

Step 4: With the natural cooling of the chamber, the temperature of the PECVD chamber is reduced to 240° C., introduce silane, and deposit the i-type intrinsic amorphous silicon layer on the n-type silicon nanowire (corresponding to a-Si:H in FIG. 1; deposition parameters: the hydrogen flow rate is 20 sccm (10-30 sccm is acceptable), the silane flow rate is 20 sccm, the chamber pressure is 30 Pa, and the ignition power is 10 W) for 30 minutes.

Step 5: On this basis, introduce the mixed gas of borane with a volume fraction of 5% and silane with a volume fraction of 95% to prepare a p-type amorphous silicon layer (corresponding to the p-type silicon outer layer in FIG. 1; deposition parameters: hydrogen flow rate is 20 sccm (10-30 sccm is acceptable), silane flow rate is 20 sccm, borane in silane accounts for 5%, chamber pressure is 30 Pa, ignition power is 10 W, and time is 6 minutes), and obtain silicon nanowires with n-i-p structure.

Step 6: Based on the n-i-p structure silicon nanowire, deposit a layer of ITO film by magnetron sputtering (parameters of magnetron sputtering deposition: substrate temperature: 200° C., power: 100 W, argon gas and oxygen gas: 40 sccm and 0.5 sccm, respectively, ITO film thickness: 200 nm) as the top electrode light-transmitting layer, and deposit a gold film with a thickness of about 2 nm by thermal evaporation process (The parameters of thermal evaporation process: the vacuum degree of the chamber is 104 Pa, the vapor deposition rate is 0.1 Å/s and the time is 3.3 minutes) to construct the tunneling layer of tandem solar cell.

Step 7: Prepare an n-type SnO$_2$ electron transmission layer (deposition rate is 0.2 Å/s) on the tunneling layer by magnetron sputtering, the thickness is 20 nm, the annealing temperature is 200° C., and the annealing time is 20 minutes.

Step 8: Put the sample prepared in the above steps 1-7 into a thermal evaporation chamber, and at the same time, take a certain amount of PbI$_2$ powder and MAI (methylamine iodine) powder (the amount of PbI$_2$ powder and MAI powder can meet the requirements for depositing perovskite thin films) and put them in a crucible, and vacuumize the chamber, and when the chamber pressure reaches 10 Pa, perform thermal evaporation deposition on perovskite thin films: firstly, deposit a layer of PbI$_2$ thin films with a thickness of 250 nm, and then, deposit a layer of MAI thin film with a thickness of 250 nm (the deposition rate is 0.5 Å/s). After the deposition is completed, take out the samples and anneal in dry air at 150° C. for 10 minutes to obtain perovskite films.

Step 9: Deposit a p-type hole transmission layer 2,2',7, 7'-tetra [N,N-bis(4-methoxyphenyl)amino]-9,9'-Spiro-OMeTAD film on the perovskite film by thermal evaporation, wherein the deposition rate is 0.5 Å/s, and the thickness is 200 nm to obtain the hole transmission layer.

Step 10: Vapor deposit a layer of MoO$_3$ buffer layer on the surface of the hole transmission layer (vapor deposition parameters: the vacuum degree of the chamber is 104 Pa, and the vapor deposition rate is 0.2 Å/s) with a thickness of about 10 nm. Then, place the sample with the MoO$_3$ buffer layer vapor deposited in a mask, and prepare a layer of ITO film as a transparent electrode by magnetron sputtering (substrate temperature: 100° C., power: 100 W, argon and oxygen: 40 sccm and 0.5 sccm, respectively, and ITO film thickness: 200 nm), and a complete three-dimensional framework silicon/perovskite tandem solar cell is prepared.

Figure 3:
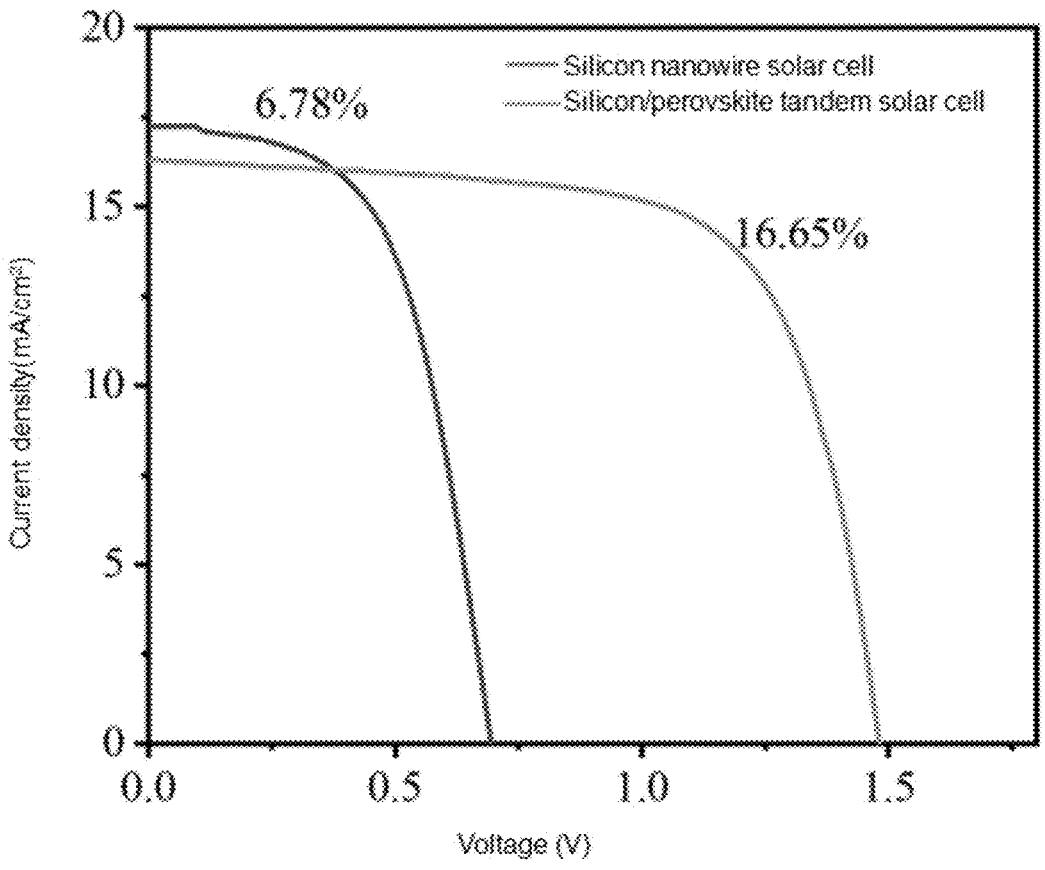
FIG. 3 is the volt-ampere characteristic (J-V) curve of the three-dimensional framework silicon/perovskite tandem solar cell prepared in Embodiment 1 of the present invention.

The volt-ampere characteristic (J-V) curve of the three-dimensional framework silicon/perovskite tandem solar cell prepared in this embodiment is shown in FIG. 3. As can be seen from FIG. 3, the photoelectric conversion efficiency of the three-dimensional framework silicon/perovskite tandem solar cell prepared in this embodiment is 16.65%, the open circuit voltage is 1.48 V, the short circuit current is 16.30 mA/cm$^2$, and the filling factor is 0.69.

Embodiment 2 (p Silicon Wafer, p-i-n)

This embodiment provides a preparation method the three-dimensional framework silicon/perovskite tandem solar cell with the p-type silicon wafer as a substrate by vapor phase deposition technology, and the specific steps are as follows:

Step 1: The only difference from Step 1 of Embodiment 1 is that the n-type silicon wafer is replaced by the p-type silicon wafer.

Step 2: Same as Step 2 of Embodiment 1.

Step 3: Heat the PECVD chamber to 400° C., introduce mixed gas of borane with a volume fraction of 5% and silane with a volume fraction of 95%, and perform ignition growth (time is 8 minutes; keep the temperature in the chamber at 400° C. during the ignition growth), and prepare p-type silicon nanowires with a length of about 500-700 nm and a diameter of about 100-200 nm.

Step 4: When the temperature of the PECVD chamber is reduced to 240° C., introduce silane, and deposit the i-type intrinsic amorphous silicon layer on the p-type silicon nanowire (deposition parameters: the hydrogen flow rate is 20 sccm, the silane flow rate is 20 sccm, the chamber pressure is 30 Pa, and the ignition power is 10 W) for 30 minutes.

Step 5: On this basis, introduce the mixed gas of phosphorane with a volume fraction of 5% and silane with a volume fraction of 95% to prepare a n-type amorphous silicon layer (corresponding to the n-type silicon outer layer in FIG. 1; deposition parameters: hydrogen flow rate is 20 sccm, silane flow rate is 20 sccm, borane in silane accounts for 5%, chamber pressure is 30 Pa, ignition power is 10 W, and time is 6 minutes), and obtain silicon nanowires with p-i-n structure.

Step 6: Based on the p-i-n structure silicon nanowire, deposit a layer of ITO film by magnetron sputtering (parameters of magnetron sputtering deposition: substrate temperature: 200° C., power: 100 W, argon gas and oxygen gas: 40 sccm and 0.5 sccm, respectively, ITO film thickness: 200 nm) as the top electrode light-transmitting layer, and deposit a gold film with a thickness of about 2 nm by thermal evaporation process (The parameters of thermal evaporation process: the vacuum degree of the chamber is 104 Pa, the vapor deposition rate is 0.1 Å/s and the time is 3.3 minutes) to construct the tunneling layer of tandem solar cell.

Step 7: Prepare a p-type $NiO_x$ hole transmission layer (deposition rate is 0.2 Å/s) on the tunneling layer by magnetron sputtering, the thickness is 20 nm, the annealing temperature is 300° C., and the annealing time is 20 minutes.

Step 8: Put the sample prepared in the above steps 1-7 into a thermal evaporation chamber, and at the same time, take a certain amount of $PbI_2$ powder and MAI powder and put them in crucible, and vacuumize the chamber, and when the chamber pressure reaches 10 Pa, perform thermal evaporation deposition on perovskite thin films: firstly, deposit a layer of $PbI_2$ thin films with a thickness of 250 nm, and then, deposit a layer of MAI thin film with a thickness of 250 nm (the deposition rate is 0.5 Å/s). After the deposition is completed, take out the samples and anneal in dry air at 150° C. for 10 minutes to obtain perovskite films.

Step 9: Deposit an n-type electron transmission layer C60 thin film on the perovskite thin film by thermal evaporation (thermal evaporation parameters: the vacuum degree of the chamber is 104 Pa, the evaporation rate is 0.2 Å/s, the deposition rate is 0.5 Å/s, and the thickness is 20 nm, and then deposit a $SnO_2$ electron transmission layer with the thickness of 10 nm on the atomic layer.

Step 10: Subsequently, place the sample in a mask, and prepare a layer of ITO film as a transparent electrode by magnetron sputtering (the deposition rate is 0.5 Å/s, and the thickness is 200 nm) to prepare a complete three-dimensional framework silicon/perovskite tandem solar cell.

Figure 4:
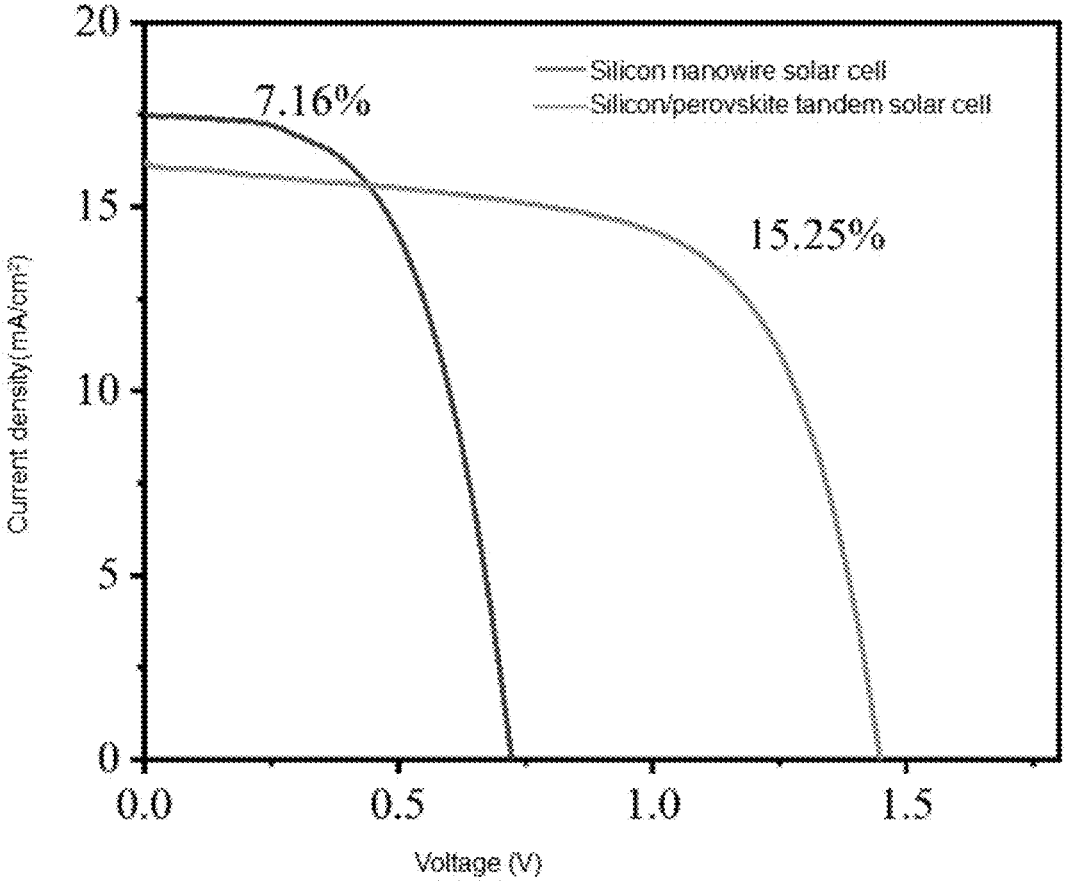
FIG. 4 is the volt-ampere characteristic (J-V) curve of the three-dimensional framework silicon/perovskite tandem solar cell prepared in Embodiment 2 of the present invention.

The volt-ampere characteristic (J-V) curve of the three-dimensional framework silicon/perovskite tandem solar cell prepared in this embodiment is shown in FIG. 4. As can be seen from FIG. 4, the photoelectric conversion efficiency of the three-dimensional framework silicon/perovskite tandem solar cell prepared in this embodiment is 15.25%, the open circuit voltage is 1.46 V, the short circuit current is 16.22 mA/cm$^2$, and the filling factor is 0.64.

Embodiment 3 (AZO Substrate, n-i-p)

This embodiment provides a preparation method the three-dimensional framework silicon/perovskite tandem solar cell with the AZO transparent conductive glass as a substrate by vapor phase deposition technology, and the specific steps are as follows:

Step 1: Perform ultrasonic cleaning on the AZO transparent conductive glass with detergent, isopropanol and deionized water in turn; then, blow dry the cleaned AZO transparent conductive glass and place in an ultraviolet-ozone device for surface treatment, and deposit a layer of metal Sn film with a thickness of 5 nm on its surface (deposit at a vacuum degree of $10^{-4}$ Pa with a deposition rate of 0.1 Å/s), thus obtaining the AZO transparent conductive substrate coated with the Sn film.

Step 2: Place the AZO transparent conductive substrate coated with Sn film obtained in step 1 in a PECVD chamber, vacuumize, and then treat with hydrogen plasma for 2 minutes (parameter setting of plasma treatment: firstly vacuumize the chamber to $10^{-4}$ Pa, then heat the sample to 200° C. through a heating table, and introduce hydrogen at 20 sccm, keep the vacuum degree in the chamber at 20 Pa, and make hydrogen ignite for 3 minutes) to obtain Sn film nanoparticles.

Step 3: Same as step 3 of Embodiment 1.
Step 4: Same as step 4 of Embodiment 1.
Step 5: Same as step 5 of Embodiment 1.
Step 6: Same as step 6 of Embodiment 1.
Step 7: Same as step 7 of Embodiment 1.
Step 8: Same as step 8 of Embodiment 1.
Step 9: Same as step 9 of Embodiment 1.
Step 10: Same as step 10 of Embodiment 1.

Embodiment 4: (AZO, p-i-n)

This embodiment provides a preparation method the three-dimensional framework silicon/perovskite tandem solar cell with the AZO transparent conductive glass as a substrate by vapor phase deposition technology, and the specific steps are as follows:

Step 1: Perform ultrasonic cleaning on the AZO transparent conductive glass with detergent, isopropanol and deionized water in turn; then, blow dry the cleaned transparent conductive glass and place in an ultraviolet-ozone device for surface treatment, and deposit a layer of metal Sn film with a thickness of 5 nm on its surface (deposit at a vacuum degree of $10^{-4}$ Pa with a deposition rate of 0.1 Å/s), thus obtaining the AZO transparent conductive substrate coated with the Sn film.

Step 2: Place the AZO transparent conductive substrate coated with Sn film obtained in step 1 in a PECVD chamber, vacuumize, and then treat with hydrogen plasma for 2 minutes (parameter setting of plasma treatment: firstly vacuumize the chamber to $10^{-4}$ Pa, then heat the sample to 200° C. through a heating table, and introduce hydrogen at 20 sccm, keep the vacuum degree in the chamber at 20 Pa, and make hydrogen ignite for 3 minutes) to obtain Sn film nanoparticles.

Step 3: Same as step 3 of Embodiment 2.
Step 4: Same as step 4 of Embodiment 2.
Step 5: Same as step 5 of Embodiment 2.
Step 6: Same as step 6 of Embodiment 2.
Step 7: Same as step 7 of Embodiment 2.
Step 8: Same as step 8 of Embodiment 2.
Step 9: Same as step 9 of Embodiment 2.
Step 10: Same as step 10 of Embodiment 2.

Embodiment 5: (Tin Foil Paper, n-i-p)

This embodiment provides a preparation method the three-dimensional framework silicon/perovskite tandem solar cell with the tin foil paper as a substrate by vapor phase deposition technology, and the specific steps are as follows:

Step 1: Perform ultrasonic cleaning on the tin foil paper with detergent, isopropanol and deionized water in turn; then, blow dry the cleaned tin foil paper and place in an ultraviolet-ozone device for surface treatment.

Step 2: Place the tin foil paper treated in step 1 in a PECVD chamber, vacuumize, and then treat with hydrogen plasma for 2 minutes (parameter setting of plasma treatment: firstly vacuumize the chamber to $10^{-4}$ Pa, then heat the sample to 200° C. through a heating table, and introduce hydrogen at 20 sccm, keep the vacuum degree in the chamber at 20 Pa, and make hydrogen ignite for 3 minutes) to obtain Sn film nanoparticles.

Step 3: Same as step 3 of Embodiment 1.
Step 4: Same as step 4 of Embodiment 1.
Step 5: Same as step 5 of Embodiment 1.
Step 6: Same as step 6 of Embodiment 1.
Step 7: Same as step 7 of Embodiment 1.
Step 8: Same as step 8 of Embodiment 1.
Step 9: Same as step 9 of Embodiment 1.
Step 10: Same as step 10 of Embodiment 1.

Figure 5:
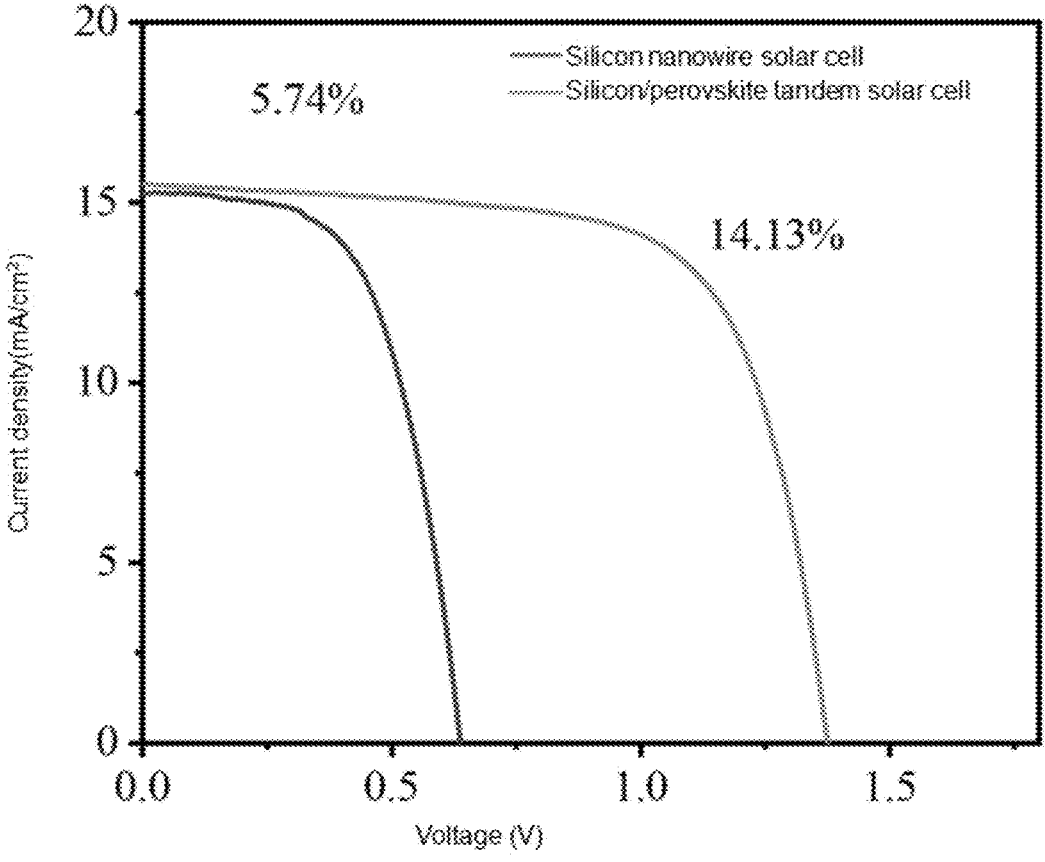
FIG. 5 is the volt-ampere characteristic (J-V) curve of the three-dimensional framework silicon/perovskite tandem solar cell prepared in Embodiment 5 of the present invention.

The volt-ampere characteristic (J-V) curve of the three-dimensional framework silicon/perovskite tandem solar cell prepared in this embodiment is shown in FIG. 5. As can be seen from FIG. 5, the photoelectric conversion efficiency of the three-dimensional framework silicon/perovskite tandem solar cell prepared in this embodiment is 14.13%, the open circuit voltage is 1.36 V, the short circuit current is 15.51 mA/cm², and the filling factor is 0.67.

Embodiment 6: (Tin Foil Paper, p-i-n)

This embodiment provides a preparation method the three-dimensional framework silicon/perovskite tandem solar cell with the tin foil paper as a substrate by vapor phase deposition technology, and the specific steps are as follows:

Step 1: Perform ultrasonic cleaning on the tin foil paper with detergent, isopropanol and deionized water in turn; then, blow dry the cleaned tin foil paper and place in an ultraviolet-ozone device for surface treatment.

Step 2: Place the tin foil paper treated in step 1 in a PECVD chamber, vacuumize, and then treat with hydrogen plasma for 2 minutes to obtain Sn film nanoparticles.

Step 3: Same as step 3 of Embodiment 2.
Step 4: Same as step 4 of Embodiment 2.
Step 5: Same as step 5 of Embodiment 2.
Step 6: Same as step 6 of Embodiment 2.
Step 7: Same as step 7 of Embodiment 2.
Step 8: Same as step 8 of Embodiment 2.
Step 9: Same as step 9 of Embodiment 2.
Step 10: Same as step 10 of Embodiment 2.

Figure 6:
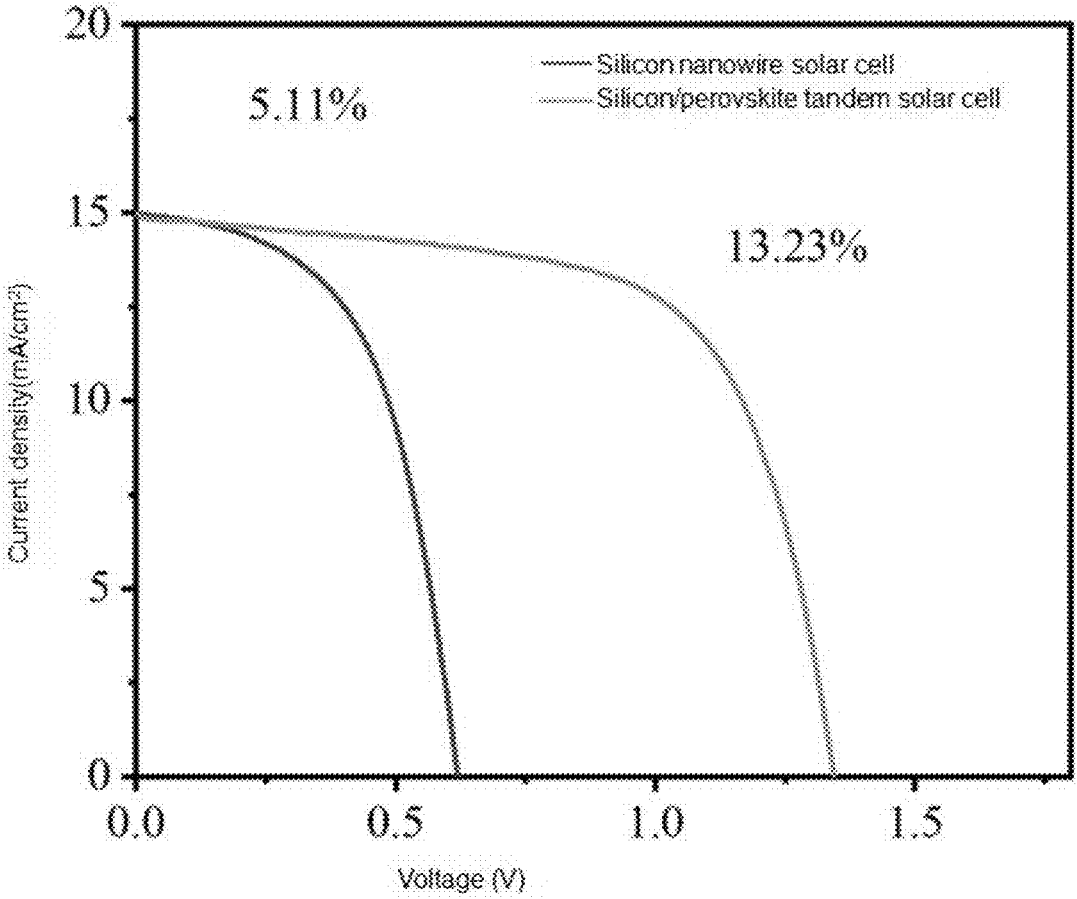
FIG. 6 is the volt-ampere characteristic (J-V) curve of the three-dimensional framework silicon/perovskite tandem solar cell prepared in Embodiment 6 of the present invention.

The volt-ampere characteristic (J-V) curve of the three-dimensional framework silicon/perovskite tandem solar cell prepared in this embodiment is shown in FIG. 6. As can be seen from FIG. 6, the photoelectric conversion efficiency of the three-dimensional framework silicon/perovskite tandem solar cell prepared in this embodiment is 13.23%, the open circuit voltage is 1.36 V, the short circuit current is 14.97 mA/cm², and the filling factor is 0.65.

Embodiment 7: (n-Type Silicon Wafer, n-i-p)

This embodiment provides a preparation method the three-dimensional framework silicon/perovskite tandem solar cell with the n-type silicon wafer as a substrate by vapor phase deposition technology, and the specific steps are as follows:

Step 1: Same as step 1 of Embodiment 1.
Step 2: Same as step 2 of Embodiment 1.
Step 3: Same as step 3 of Embodiment 1.
Step 4: Same as step 4 of Embodiment 1.
Step 5: Same as step 5 of Embodiment 1.
Step 6: Same as step 6 of Embodiment 1.
Step 7: Same as step 7 of Embodiment 1.
Step 8: Put the sample prepared in the above steps 1-7 into a thermal evaporation chamber, and at the same time, take a certain amount of $PbBr_2$ powder and CsBr powder and put them in crucible, and vacuumize the chamber, and when the chamber pressure reaches 10 Pa, perform thermal evaporation deposition on perovskite thin films: firstly, deposit a layer of $PbBr_2$ thin films with a thickness of 250 nm, and then, deposit a layer of CsBr thin film with a thickness of 250 nm (the deposition rate is 0.5 Å/s). After the deposition is completed, take out the samples and anneal in dry air at 250° C. for 10 minutes to obtain perovskite films.

Step 9: Same as step 9 of Embodiment 1.
Step 10: Same as step 10 of Embodiment 1.

Embodiment 8: (p-Type Silicon Wafer, p-i-n)

This embodiment provides a preparation method the three-dimensional framework silicon/perovskite tandem solar cell with the p-type silicon wafer as a substrate by vapor phase deposition technology, and the specific steps are as follows:

Step 1: Same as step 1 of Embodiment 2.
Step 2: Same as step 2 of Embodiment 2.
Step 3: Same as step 3 of Embodiment 2.
Step 4: Same as step 4 of Embodiment 2.
Step 5: Same as step 5 of Embodiment 2.
Step 6: Same as step 6 of Embodiment 2.
Step 7: Same as step 7 of Embodiment 2.
Step 8: Put the sample prepared in the above steps 1-7 into a thermal evaporation chamber, and at the same time, take a certain amount of $PbBr_2$ powder and CsBr powder and put them in crucible, and vacuumize the chamber, and when the chamber pressure reaches 10 Pa, perform thermal evaporation deposition on perovskite thin films: firstly, deposit a layer of $PbBr_2$ thin films with a thickness of 250 nm, and then, deposit a layer of CsBr thin film with a thickness of 250 nm (the deposition rate is 0.5 Å/s). After the deposition is completed, take out the samples and anneal in dry air at 250° C. for 10 minutes to obtain perovskite films.

Step 9: Same as step 9 of Embodiment 2.
Step 10: Same as step 10 of Embodiment 2.

Comparative Example 1

Step 1: Same as step 1 of Embodiment 1.
Step 2: Same as step 2 of Embodiment 1.
Step 3: Same as step 3 of Embodiment 1.
Step 4: Same as step 4 of Embodiment 1.
Step 5: Same as step 5 of Embodiment 1.
Step 6: Based on the n-i-p structure silicon nanowire, deposit a layer of ITO film by magnetron sputtering (parameters of magnetron sputtering deposition: substrate temperature: 200° C., power: 100 W, argon gas and oxygen gas: 40 sccm and 0.5 sccm, respectively, ITO film thickness: 200 nm) as the top electrode light-transmitting layer; obtain the silicon nanowire solar cell.

The volt-ampere characteristic (J-V) curve of the silicon nanowire solar cell prepared in this comparative example is shown in FIG. 3. As can be seen from FIG. 3, the photoelectric conversion efficiency of the silicon nanowire solar cell prepared in this comparative example is 6.78%, the open circuit voltage is 0.70 V, the short circuit current is 17.25 mA/cm$^2$, and the filling factor is 0.56.

Comparative Example 2

Step 1: Same as step 1 of Embodiment 2.
Step 2: Same as step 2 of Embodiment 2.
Step 3: Same as step 3 of Embodiment 2.
Step 4: Same as step 4 of Embodiment 2.
Step 5: Same as step 5 of Embodiment 2.
Step 6: Based on the p-i-n structure silicon nanowire, deposit a layer of ITO film by magnetron sputtering (parameters of magnetron sputtering deposition: substrate temperature: 200° C., power: 100 W, argon gas and oxygen gas: 40 sccm and 0.5 sccm, respectively, ITO film thickness: 200 nm) as the top electrode light-transmitting layer; obtain the silicon nanowire solar cell.

The volt-ampere characteristic (J-V) curve of the silicon nanowire solar cell prepared in this comparative example is shown in FIG. 4. As can be seen from FIG. 4, the photoelectric conversion efficiency of the silicon nanowire solar cell prepared in this comparative example is 7.16%, the open circuit voltage is 0.72 V, the short circuit current is 17.50 mA/cm$^2$, and the filling factor is 0.57.

Comparative Example 3

Step 1: Same as step 1 of Embodiment 5.
Step 2: Same as step 2 of Embodiment 5.
Step 3: Same as step 3 of Embodiment 5.
Step 4: Same as step 4 of Embodiment 5.
Step 5: Same as step 5 of Embodiment 5.
Step 6: Based on the n-i-p structure silicon nanowire, deposit a layer of ITO film by magnetron sputtering (parameters of magnetron sputtering deposition: substrate temperature: 200° C., power: 100 W, argon gas and oxygen gas: 40 sccm and 0.5 sccm, respectively, ITO film thickness: 200 nm) as the top electrode light-transmitting layer; obtain the silicon nanowire solar cell.

The volt-ampere characteristic (J-V) curve of the silicon nanowire solar cell prepared in this comparative example is shown in FIG. 5. As can be seen from FIG. 5, the photoelectric conversion efficiency of the silicon nanowire solar cell prepared in this comparative example is 5.74%, the open circuit voltage is 0.64 V, the short circuit current is 1527 mA/cm$^2$, and the filling factor is 0.59.

Comparative Example 4

Step 1: Same as step 1 of Embodiment 6.
Step 2: Same as step 2 of Embodiment 6.
Step 3: Same as step 3 of Embodiment 6.
Step 4: Same as step 4 of Embodiment 6.
Step 5: Same as step 5 of Embodiment 6.
Step 6: Based on the p-i-n structure silicon nanowire, deposit a layer of ITO film by magnetron sputtering (parameters of magnetron sputtering deposition: substrate temperature: 200° C., power: 100 W, argon gas and oxygen gas: 40 sccm and 0.5 sccm, respectively, ITO film thickness: 200 nm) as the top electrode light-transmitting layer; obtain the silicon nanowire solar cell.

The volt-ampere characteristic (J-V) curve of the silicon nanowire solar cell prepared in this comparative example is shown in FIG. 6. As can be seen from FIG. 6, the photoelectric conversion efficiency of the silicon nanowire solar cell prepared in this comparative example is 5.11%, the open circuit voltage is 0.62 V, the short circuit current is 15.03 mA/cm$^2$, and the filling factor is 0.55.

The above-mentioned embodiments only describe the preferred mode of the present invention, and do not limit the scope of the invention. Under the premise of not departing from the design spirit of the invention, various modifications and improvements made by ordinary technicians in the field to the technical scheme of the invention shall fall within the protection scope determined by the claims of the invention.

What is claimed is:

1. A preparation method for a three-dimensional framework silicon/perovskite tandem solar cell, wherein the three-dimensional framework silicon/perovskite tandem solar cell is in a formal structure, and the preparation method for the three-dimensional framework silicon/perovskite tandem solar cell comprises the following steps:

step 1: preparing an n-type silicon nanowire on a substrate;

step 2: sequentially depositing an i-type intrinsic amorphous silicon layer, a p-type amorphous silicon layer and a top electrode light-transmitting layer on the n-type silicon nanowire; and step 3: sequentially preparing an n-type transmission layer, a perovskite film, a p-type transmission layer, a buffer layer and a transparent electrode on the top electrode light-transmitting layer to obtain the three-dimensional framework silicon/perovskite tandem solar cell;

wherein the preparation method further comprises:

preparing metal tin (Sn) film nanoparticles on a surface of the substrate before preparing the n-type silicon nanowire on the substrate;

constructing a tunneling layer of a gold film on the top electrode light-transmitting layer before preparing the n-type transmission layer on the top electrode light-transmitting layer;

wherein the n-type silicon nanowire is multiple in quantity arranged in a spatial array; the i-type intrinsic amorphous silicon layer, the p-type amorphous silicon layer, the top electrode light-transmitting layer, the tunneling layer, the n-type transmission layer, the perovskite thin film, the p-type transmission layer, the buffer layer, and the transparent electrode are sequentially deposited around each of the multiple n-type silicon nanowires by a layer-by-layer manner to form the three-dimensional framework silicon/perovskite tandem solar cell; and wherein the perovskite film is prepared by:

taking lead diiodide (PbI$_2$) powder and methylamine iodine (MAI) powder, depositing a layer of PbI$_2$ film with a thickness of 250 nm and subsequently depositing a layer of MAI film with a thickness of 250 nm at a deposition rate of 0.5 angstroms per second (Å/s) under a pressure of 10 pascals (Pa) to obtain a deposition product, and annealing the deposition product in dry air at 150° C. for 10 minutes to obtain the perovskite film.

2. The preparation method for the three-dimensional framework silicon/perovskite tandem solar cell as claimed in claim 1, wherein an annealing temperature of the n-type transmission layer is 150 Celsius degrees (° C.) to 500° C. for 30 minutes (min) to 60 min.

3. The preparation method for the three-dimensional framework silicon/perovskite tandem solar cell as claimed in claim 1, wherein the perovskite film is prepared by liquid-phase spin coating, vacuum vapor phase deposition or liquid-phase assisted vapor phase method.

4. The preparation method for the three-dimensional framework silicon/perovskite tandem solar cell as claimed in claim 1, wherein the n-type transmission layer is prepared by vapor deposition, magnetron sputtering, liquid phase spin coating/spraying or chemical water bath deposition; and the p-type transmission layer is prepared by liquid phase spin coating, vacuum vapor phase deposition or magnetron sputtering.

5. The preparation method for the three-dimensional framework silicon/perovskite tandem solar cell as claimed in claim 1, wherein, a length of the n-type silicon nanowire is 300 nanometers (nm) to 10000 nm and a diameter is 10 nm to 300 nm.

6. The preparation method for the three-dimensional framework silicon/perovskite tandem solar cell as claimed in claim 1, wherein, the substrate is one selected from the group consisting of a p-type silicon wafer, an n-type silicon wafer, an aluminum-doped zinc oxide (AZO) transparent conductive glass and a tin foil paper.

* * * * *